United States Patent
Santhanam et al.

(10) Patent No.: US 8,501,605 B2
(45) Date of Patent: Aug. 6, 2013

(54) METHODS AND APPARATUS FOR CONFORMAL DOPING

(75) Inventors: Kartik Santhanam, Milpitas, CA (US); Martin A. Hilkene, Gilroy, CA (US); Manoj Vellaikal, Sunnyvale, CA (US); Mark R. Lee, Park City, UT (US); Matthew D. Scotney-Castle, Morgan Hill, CA (US); Peter I. Porshnev, Poway, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/188,824

(22) Filed: Jul. 22, 2011

(65) Prior Publication Data
US 2012/0238074 A1    Sep. 20, 2012

Related U.S. Application Data (60) Provisional application No. 61/452,497, filed on Mar. 14, 2011.

(51) Int. Cl.
*H01L 21/22* (2006.01)
*H01L 21/38* (2006.01)

(52) U.S. Cl.
USPC ............ 438/559; 438/795; 257/E21.25

(58) Field of Classification Search
USPC ............ 438/249, 795, 559; 257/E21.25
See application file for complete search history.

(56) References Cited

U.S. PATENT DOCUMENTS

| | | | |
|---|---|---|---|
| 6,900,091 B2 * | 5/2005 | Williams et al. | 438/228 |
| 7,326,610 B2 * | 2/2008 | Amos et al. | 438/231 |
| 7,358,511 B2 * | 4/2008 | Sasaki et al. | 250/492.21 |
| 7,737,010 B2 * | 6/2010 | Qin et al. | 438/513 |
| 8,187,928 B2 * | 5/2012 | Yu et al. | 438/156 |
| 8,202,792 B2 * | 6/2012 | Papasouliotis et al. | 438/527 |
| 2005/0059260 A1 | 3/2005 | Bu et al. | |
| 2010/0173484 A1 | 7/2010 | Foad et al. | |

OTHER PUBLICATIONS

Johnny C. Ho et al., "Wafer-Scale, Sub-5 nm Junction Formation by Monolayer Doping and Conventional Spike Annealing", Nano Letters, vol. 9, No. 2, 2009, pp. 725-730.
International Search Report and Written Opinion mailed 94 Oct. 2012 for PCT Application No. PCT/US2012/027659.

* cited by examiner

*Primary Examiner* — William D Coleman
(74) *Attorney, Agent, or Firm* — Moser Taboada; Alan Taboada (57) ABSTRACT

Methods and apparatus for processing a substrate are provided herein. In some embodiments, a method of doping a substrate may include forming a dopant region on a substrate by implanting one or more dopant elements into the dopant region of the substrate using a plasma doping process; forming a cap layer atop the dopant region; annealing the dopant region after forming the cap layer; and removing the cap layer after annealing the dopant region.

18 Claims, 4 Drawing Sheets

METHODS AND APPARATUS FOR CONFORMAL DOPING

CROSS-REFERENCE TO RELATED APPLICATIONS

This application claims benefit of U.S. provisional patent application Ser. No. 61/452,497, filed Mar. 14, 2011, which is herein incorporated by reference.

FIELD

Embodiments of the present invention generally relate to semiconductor manufacturing, and more specifically to methods for doping substrates.

BACKGROUND

Typical dopants used for N-type implant processes targeting conformal FINFET, conformal DRAM, and conformal flash doping application include arsenic and phosphorus. Conventionally, an ion beam implantation process is used to dope substrates, referred to as a beamline process. In the beamline process, various substrate tilt combinations need to be used to ensure that sidewall surfaces of features formed on the substrate are satisfactorily implanted. However, at high tilt angles of the substrate, the side walls of closely packed structures may not be fully exposed to the ion beam, which undesirably leads to non uniform distribution of the dopant material. This is known as the shadowing effect.

Accordingly, the inventors have provided improved conformal doping methods.

SUMMARY

Methods and apparatus for conformal doping of substrates are provided herein. In some embodiments, the inventive methods may advantageously limiting dopant loss and achieve enhanced dopant diffusion. Methods and apparatus for processing a substrate are provided herein. In some embodiments, a method of doping a substrate may include forming a dopant region on a substrate by implanting one or more dopant elements into the dopant region of the substrate using a plasma doping process; forming a cap layer atop the dopant region; annealing the dopant region after forming the cap layer; and removing the cap layer after annealing the dopant region.

In some embodiments, a method of doping a substrate may comprise forming a dopant region on a substrate by implanting one or more dopant elements into the dopant region of the substrate in a plasma doping process; forming a cap layer atop the dopant region; reducing a thickness of the cap layer; annealing the dopant region after reducing the thickness of the cap layer; and removing the cap layer from atop the dopant region after annealing the dopant region.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide improved methods for doping substrates. Embodiments of the present invention may advantageously limiting dopant loss and may achieve enhanced dopant diffusion. Exemplary, but non-limiting, examples of applications in which embodiments of the present invention may be used include the fabrication of logic, DRAM, flash, and FINFET structures and devices. Exemplary, but non-limiting, examples of target areas for the improved conformal doping process may include polysilicon, ultra shallow junction (USJ), source drain regions, and silicon deep trench regions.

The inventors have observed that plasma doping technology is an attractive alternative to traditional beam-line ion implantation due to simplicity and high productivity. However, the inventors have observed that plasma doped substrates tend to have a very high surface concentration of dopants. As a result, the inventors believe that the dopants may be lost in post doping processing, for example, while exposed to high temperatures for extended times. The dopant loss may depend on many factors, including delay time between doping and subsequent processes, such as an anneal process, anneal temperature, and ambient atmosphere. In addition, the inventors believe that an arsenic (As) or phosphorus (P) containing surface film is a safety hazard due to the high toxicity of these elements combined with the dopant loss problem discussed above. For example, arsenic implanted substrates, exposed to atmosphere, will out-gas and release arsine ($AsH_3$), which has a threshold limit value (TLV) of less than 50 parts per billion (ppb).

The inventors have further observed that the risk of out-gassing is removed (or greatly limited) after an anneal process is performed on doped substrates, thus making arsenic and phosphorus doped substrates safer to handle. In addition, the inventors have observed that the annealed substrates do not lose dopant when exposed to atmosphere.

Figure 1:
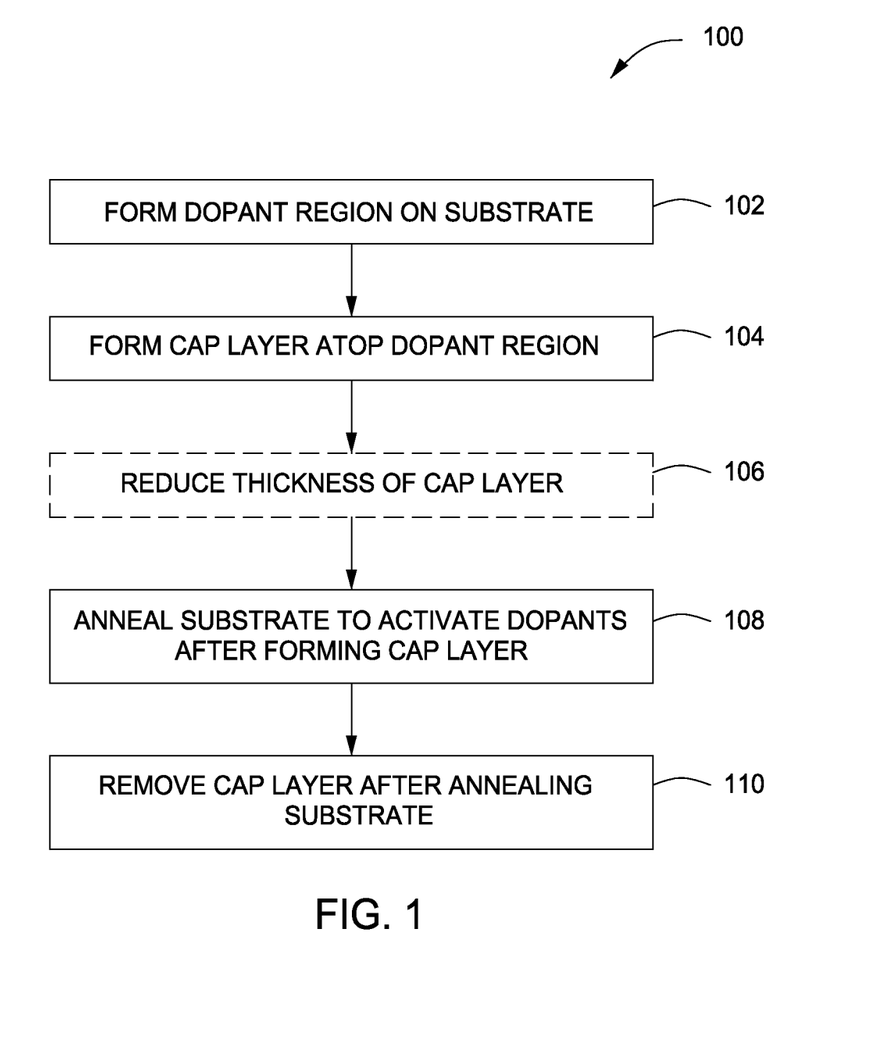
FIG. 1 is a flow diagram of a method of limiting dopant loss and achieving enhanced dopant diffusion in accordance with some embodiments of the present invention.
Figure 2A:
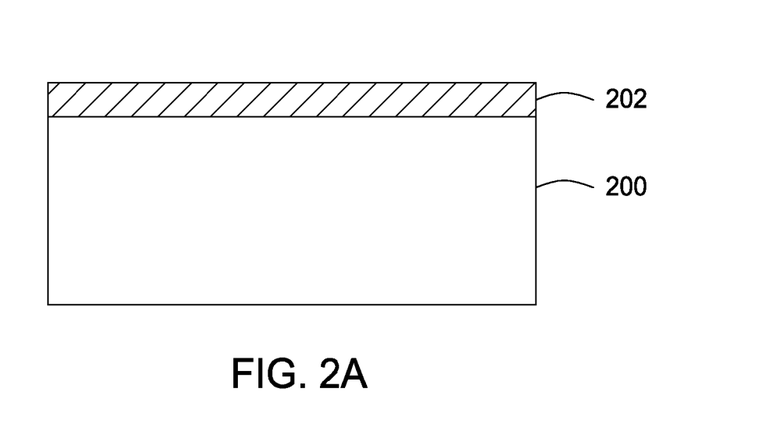
FIGS. 2A-2C depict illustrative cross-sectional views of a substrate during different stages of processing in accordance with some embodiments of the present invention.
Figure 2B:
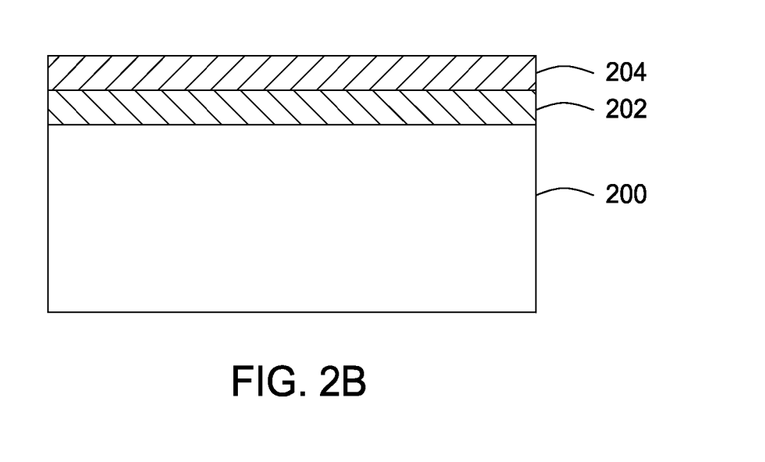
Figure 2C:
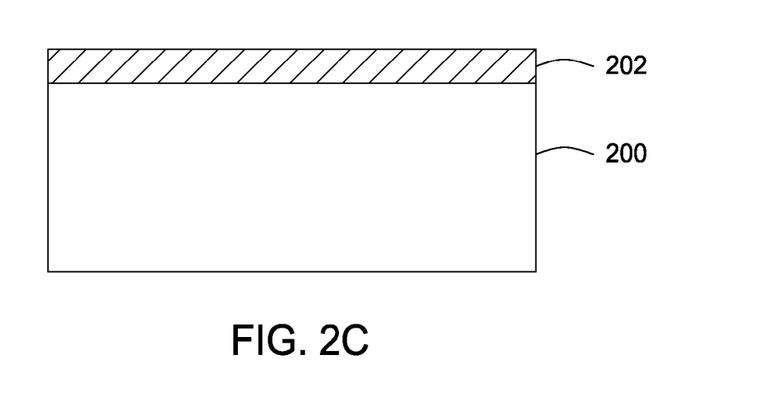

FIG. 1 depicts a method 100 for doping a substrate in accordance with some embodiments of the present invention. FIGS. 2A-2C illustrate cross-sectional views of a substrate during different stages of the present inventive method 100 depicted in FIG. 1, in accordance with some embodiments of the present invention.

The method 100 generally begins at 102, where a dopant region 202 is formed on a substrate 200, as depicted in FIG.

2A. The dopant region 202 may be formed by implanting one or more dopants into the substrate 200 in an implantation process, such as a plasma assisted implantation process. Alternatively or in combination, the doping process may also be performed by depositing a dopant precursor on a surface of the substrate 200. Either process may be performed in any suitable doping chamber (e.g., a first process chamber), such as a plasma-assisted doping chamber. Examples of suitable doping chambers include a plasma ion immersion implantation reactor, including but not limited to, the CONFORMA™ reactor commercially available from Applied Materials, Inc., of Santa Clara, Calif. One such suitable process chamber is described below with respect to FIG. 3. Although specific process chambers may be provided herein to illustrate embodiments of the invention, it is contemplated that other suitable process chambers may also be used, including process chambers from other manufacturers.

The substrate 200 may comprise any suitable material used in the fabrication of semiconductor devices. For example, in some embodiments, the substrate may comprise a semiconducting material and/or combinations of semiconducting materials and non-semiconductive materials for forming semiconductor structures and/or devices. For example, the substrate may comprise one or more silicon-containing materials such as crystalline silicon (e.g., Si<100> or Si<111>), silicon oxide, strained silicon, polysilicon, silicon wafers, glass, sapphire, or the like. The substrate may further have any desired geometry, such as a 200 or 300 mm wafer, square or rectangular panels, or the like. In some embodiments, the substrate 200 may be a semiconductor wafer (e.g., a 200 mm, 300 mm, or the like silicon wafer).

In some embodiments, the substrate may be undoped, or may contain undoped regions that are to be subsequently doped. As used herein, undoped means not having an n-type or p-type dopant contained therein. Alternatively, in some embodiments, the substrate may be doped, with further doping of the substrate or portions thereof to be performed. The substrate 200 may comprise one or more layers, and in some embodiments, the substrate 200 may further include completed or partially completed electronic devices disposed in or on the substrate.

When doping the substrate, the entire surface of the substrate may be doped or if select regions of the substrate are to be doped, a patterned mask layer, such as a patterned photoresist layer, may be deposited atop the substrate to protect regions of the substrate that are not to be doped. For example, in some embodiments, a masking layer, such as a layer of photoresist, may be provided and patterned such that the dopant region 202 is formed only on portions of the substrate 200.

The one or more dopants to be implanted may comprise any suitable element or elements typically used in semiconductor doping processes. Examples of suitable dopants include one or more of group III elements or group V elements, such as, in a non-limiting example, arsenic (As), boron (B), indium (In), phosphorous (P), antimony (Sb), or the like. Examples of n-type dopants may include at least one of phosphorus, arsenic, or the like. For example arsine ($AsH_3$), diarsenic fluoride ($As_2F_5$), phosphine ($PH_3$), or phosphorus trifluoride ($PF_3$) are typical dopant precursors used for n-type implant process targeting conformal FINFET (FIN Field Effect Transistors), conformal DRAM (Dynamic Random Access Memory) and conformal Flash doping applications. For p-type doping, boron-containing precursors, such as boron trifluoride ($BF_3$), diborane ($B_2H_6$), or the like, may be used. Examples of other dopants suitable for material modification of the substrate, or portions thereof, include germane ($GeH_4$), methane ($CH_4$), carbon dioxide ($CO_2$), carbon tetrafluoride ($CF_4$), silane ($SiH_4$), silicon tetrafluoride ($SiF_4$), nitrogen ($N_2$), and oxygen ($O_2$).

In some embodiments, the one or more dopants may be implanted using a low energy implant process at very low pressure with minimal gas flow. Such a process may advantageously add the contribution of neutral ions during the implant, which slows down the dose rate. Alternatively, the implant pressure may be increased and the process gas flow may be reduced in order to increase the residence time of the dopant ions in the low energy implant process.

For example, the dopant region 202 may be formed by providing a first process gas comprising one or more precursor gases. The one or more precursor gases comprise the elements to be implanted, for example, any of the dopant elements described above. The first process gas may be provided in a suitable flow rate, for example from about 0.5 to about 400 sccm. In some embodiments, the first process gas may further comprise a carrier gas, for example such as an inert gas including but not limited to argon, helium, nitrogen, or the like. Embodiments where a carrier gas is provided, the carrier gas may comprise up to about 90 percent of the first process gas, or between about 1 to about 99 percent of the first process gas.

A plasma may be generated from the first process gas to implant the one or more dopants into the substrate to form the dopant region, or to deposit the one or more dopants atop the substrate to form the dopant region. The plasma may be formed by applying a source power at suitable frequency to form a plasma (for example, in the MHz or GHz range).

The substrate 200 may be biased during implantation and/or deposition to control the flux of ions towards the substrate 200, and, in some embodiments, to control the depth of ion penetration into the substrate 200. For example, in some embodiments, up to about 50 to 3000 watts of a substrate bias power at a frequency of between about 0.5 to about 60 MHz, or about 2 MHz may be provided. During implantation and/or deposition, the source RF power can be about 100 to 3000 watts with a frequency between about 0.5 to about 60 MHz, or about 13.5 MHz.

The plasma may be formed in a low pressure process, thereby reducing the likelihood of contamination induced defects in the substrate 200 and/or amorphization of any underlying layer, such as a silicon-containing layer. For example, in some embodiments, the ion implantation may be performed at a pressure of between about 1 to about 500 mTorr. Moreover, ion bombardment-induced defects that may occur even at such low pressure levels may be further limited or prevented by using a remote plasma source or, optionally, by pulsing the plasma source power.

Alternatively or in combination, instead of or in addition to the implant process, the one or more dopants can be deposited on top of the substrate 200 to form the dopant region 202. The one or more dopants may be deposited atop the substrate 200, for example, in the same chamber suitable to perform the implantation process described above. For example, by reducing or eliminating the substrate bias voltage the one or more dopants may be deposited on top of the substrate. The thickness of the deposited film can be controlled by the duration of the process with no (or reduced) substrate bias voltage, the rate of flow of the one or more dopants, the pressure in the process chamber, and the level of the plasma source power.

Next, at 104, a cap layer 204 is deposited over the dopant region 202, as depicted in FIG. 2B. The inventors have observed that dopants tend to lose dose when implanted with a plasma technique due to interaction with the ambient atmosphere during a subsequent anneal process. For example, during anneal, about 50% of the dose may be lost in an oxygen ($O_2$) ambient and about 90% of the dose may be lost in a nitrogen ($N_2$) ambient. Thus, the cap layer 204 may advantageously serve as a physical barrier between the dopant region 202 and the atmosphere in order to prevent dopant loss from the dopant region 202. In embodiments where the dopants comprise toxic or otherwise unsafe materials, the cap layer makes the substrate safer to handle.

In some embodiments, the cap layer 204 is formed from a silicon containing material such as silicon dioxide ($SiO_2$), silane ($SiH_4$), silicon carbide (SiC), or the like. In some embodiments, the cap layer 204 may have a thickness in the range of up to about 100 angstroms. The cap layer 204 may be deposited by any suitable process, such as chemical vapor deposition ("CVD"), physical vapor deposition (PVD), or the like. The cap layer 204 may be formed in a deposition chamber. In some embodiments, the deposition chamber may be the first process chamber, in which the dopant region 202 was formed (i.e., the cap layer 204 may be formed in situ). Alternatively, the cap layer 204 may be formed in a different process chamber than the one in which the dopant region 202 was formed. In such embodiments, the substrate may be transferred to the cap layer deposition chamber while remaining under vacuum, for example, by using a cluster tool such as described below with respect to FIG. 4.

Next, at 106, the cap layer 204 may optionally be etched to reduce a thickness of the cap layer 204. Reducing the thickness of the cap layer facilitates easier and quicker removal of the cap layer 204 after annealing the substrate, as discussed below. The cap layer 204 may be etched in an etch chamber. The etch chamber may be the same process chamber in which the cap layer 204 was formed (e.g., the first process chamber or the cap layer deposition chamber) or in a different process chamber. In some embodiments, as the cap layer 204 protects the dopant region 202 from outgassing and/or reacting with the atmosphere, the substrate 200 may be transferred to the process chamber for etching without remaining under vacuum.

In embodiments where a mask layer is used to protect the substrate 200 during the doping process, the mask layer may be removed prior to annealing the substrate 200. For example, in some embodiments the substrate 200 may be transferred under vacuum to a mask removal chamber, where the mask layer may be removed. In some embodiments, the mask layer may be removed from the substrate 200 in-situ in the plasma doping chamber, or in an etch chamber (for example the etch chamber used to etch the cap layer 204) without transferring the substrate 200 to another chamber. In some embodiments, as the cap layer 204 protects the dopant region 202 from outgassing and/or reacting with the atmosphere, the substrate 200 may be transferred to the mask removal chamber without remaining under vacuum.

In some embodiments, the mask layer may comprise a layer of photoresist. The mask layer may be stripped, for example, by exposure to a plasma comprising one or more of oxygen ($O_2$), nitrogen trifluoride ($NF_3$), carbon tetrafluoride ($CF_4$), hydrogen ($H_2$), or nitrogen ($N_2$) gas. Depending on any damage to the mask layer, plasma chemistry, and plasma density, the mask layer can be removed in a chamber similar to the doping chamber (e.g., a P3I process chamber). For example, process parameters that may be adjusted to facilitate mask layer removal may include RF source power (e.g. RF power provided to plasma), gas flow, chamber pressure, and time. The mask removal chamber may be any chamber able to perform the optional mask removal process. Non-limiting examples of such suitable chambers include the aforementioned P3I process chamber, or the Axiom process chamber, also available from Applied Materials, Inc. Other process chambers may also be used including those available from other manufacturers.

Next, at 108, the substrate 200 is annealed to activate the dopants disposed in the dopant region. In embodiments where the one or more dopants a deposited atop the dopant region 202, the a process may facilitate driving the one or more dopants into the substrate 200. The substrate may be annealed in a dopant activation chamber. In some embodiments, the substrate may be transferred under vacuum to the dopant activation chamber, where the substrate may be annealed to activate the dopants implanted in or disposed on the substrate. In some embodiments, as the cap layer 204 protects the dopant region 202 from outgassing and/or reacting with the atmosphere, the substrate 200 may be transferred to the dopant activation chamber without remaining under vacuum.

In some embodiments, the substrate may be annealed by heating the substrate to a first temperature of between about 600 to about 1300 degrees Celsius, or at about 1000 degrees Celsius. In some embodiments, the substrate may be annealed in a two-step process comprising first heating the substrate to a first temperature of about 200 to about 800 degrees Celsius for a first period of time from about 1 second to a few hours. Subsequently, the substrate may be heated to a second, higher temperature. The second temperature may be about 800 to about 1300 degrees Celsius and may have a duration of about 1 second to about a few hours. During the anneal process, the substrate may be exposed to an inert gas such as nitrogen ($N_2$), argon (Ar), helium (He), or the like, hydrogen ($H_2$), ammonia ($NH_3$), oxygen ($O_2$), or combinations thereof. If the substrate does not have a patterned mask to protect areas for doping, the substrates can be directly transferred from the doping chamber after the doping process to the dopant activation chamber. The inventors have discovered that dopant loss and dielectric film build up (e.g., build up of a dielectric film, such as boron oxide, due to exposure to moisture) can be reduced by in-situ dopant activation (e.g., anneal) and by not exposing the substrate to the atmosphere. The dopant activation process may be a high temperature process such as an anneal, and may be performed in any suitable process chamber, such as but not limited to the RTP RADIANCE® process chamber or any other anneal tool in the CENTURA® platform, available from Applied Materials Inc.

Next, at 110, the cap layer 204 is removed, as depicted in FIG. 2C. The cap layer 204 may be removed in any suitable process chamber, such as described above at 106 for reducing the thickness of the cap layer 204. The cap layer 204 may be removed using any suitable etch process. For example, a silicon-based cap layer 204 may be removed using a fluorine precursor, such as nitrogen trifluoride ($NF_3$). Upon removal of the cap layer 204 at 110, the method 100 generally ends and the substrate may continue processing as desired to complete fabrication. Based on transmission electron microscopy (TEM) analysis on structured wafers, it has been verified that 1) implanted arsenic film and capped film is conformal with reduced deposition on the top surface (e.g., a more conformal and uniform film profiles have been provided) and 2) there is no damage to the structure after stripping the cap layer.

Figure 3:
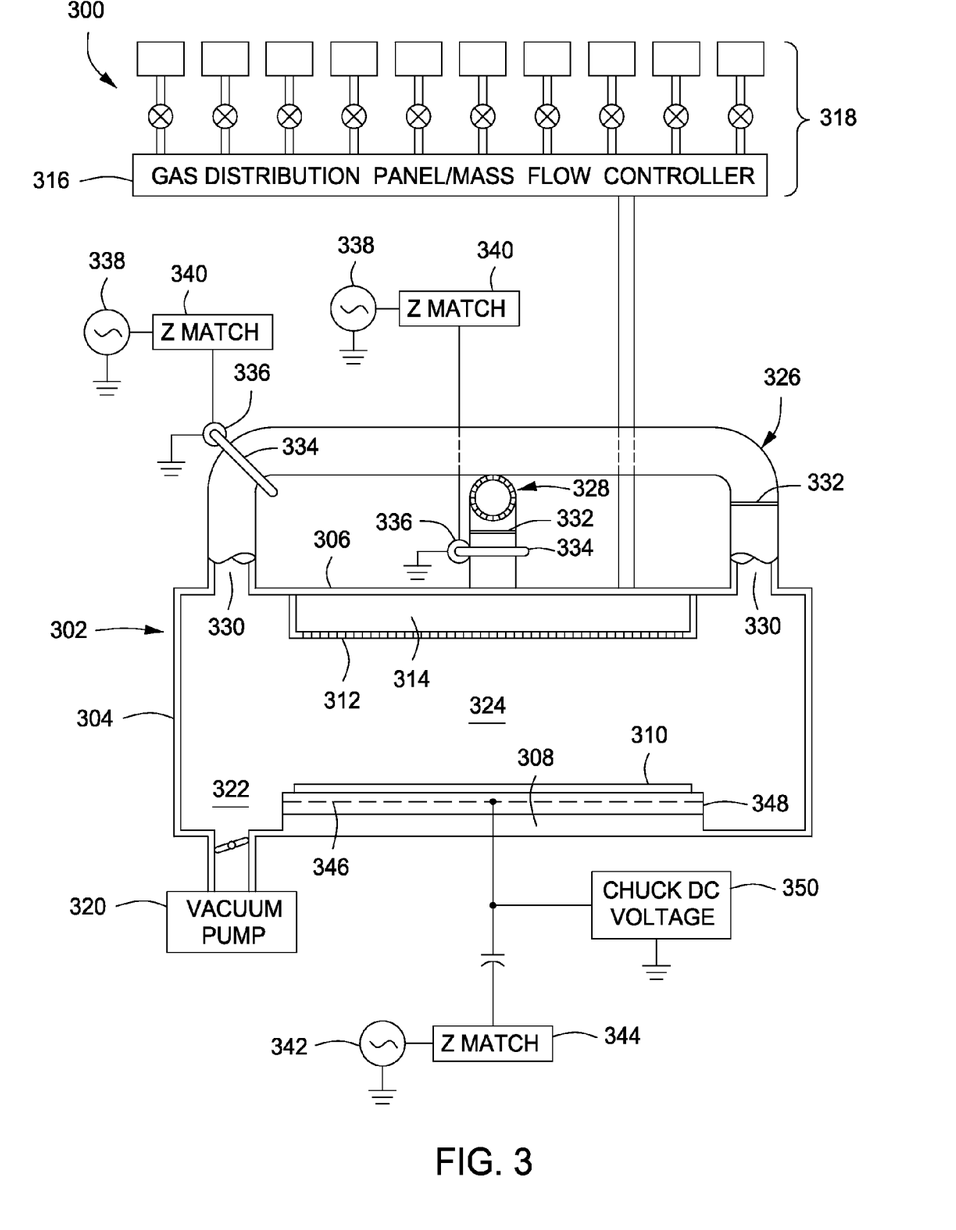
FIG. 3 depicts a plasma immersion ion implantation process chamber in accordance with some embodiments of the present invention.

Referring to FIG. 3, a toroidal source plasma immersion ion implantation ("P3i") reactor 300 of the type disclosed in the above-referenced application has a cylindrical vacuum chamber 302 defined by a cylindrical side wall 304 and a disk-shaped ceiling 306. A substrate support 308 at the floor of the chamber supports a substrate 310 to be processed. A gas distribution plate or showerhead 312 on the ceiling 306 receives process gas in its gas manifold 314 from a gas distribution panel 316 whose gas output can be any one of or mixtures of gases from one or more individual gas supplies 318. A vacuum pump 320 is coupled to a pumping annulus 322 defined between the substrate support 308 and the sidewall 304. A processing region 324 is defined between the substrate 310 and the gas distribution plate 312.

A pair of external reentrant conduits 326, 328 establishes reentrant toroidal paths for plasma currents passing through the processing region 324, and the toroidal paths intersecting in the processing region 324. Each of the conduits 326, 328 has a pair of ends 330 coupled to opposite sides of the chamber. Each conduit 326, 328 is a hollow conductive tube. Each conduit 326, 328 has a D.C. insulation ring 332 preventing the formation of a closed loop conductive path between the two ends of the conduit.

An annular portion of each conduit 326, 328, is surrounded by an annular magnetic core 334. An excitation coil 336 surrounding the core 334 is coupled to an RF power source 338 through an impedance match device 340. The two RF power sources 338 coupled to respective ones of the cores 336 may be of two slightly different frequencies. The RF power coupled from the RF power generators 338 produces plasma ion currents in closed toroidal paths extending through the respective conduit 326, 328 and through the processing region 324. These ion currents oscillate at the frequency of the respective RF power source 338. Bias power is applied to the substrate support 308 by a bias power generator 342 through an impedance match circuit 344 and/or or a DC power source 350.

Plasma formation is performed by introducing a process gas, or mixture of process gases into the chamber 324 through the gas distribution plate 312 and applying sufficient source power from the generators 338 to the reentrant conduits 326, 328 to create toroidal plasma currents in the conduits and in the processing region 324.

The plasma flux proximate the substrate surface is determined by the substrate bias voltage applied by the RF bias power generator 342. The plasma rate or flux (number of ions sampling the substrate surface per square cm per second) is determined by the plasma density, which is controlled by the level of RF power applied by the RF source power generators 338. The cumulative ion dose (ions/square cm) at the substrate 310 is determined by both the flux and the total time over which the flux is maintained.

If the substrate support 308 is an electrostatic chuck, then a buried electrode 346 is provided within an insulating plate 348 of the substrate support, and the buried electrode 346 is coupled to the bias power generator 342 through the impedance match circuit 344 or the DC power source 350.

In operation, and for example, the substrate 310 may be placed on the substrate support 308 and one or more process gases may be introduced into the chamber 302 to strike a plasma from the process gases.

In operation, a plasma may be generated from the process gases within the reactor 300 to selectively modify surfaces of the substrate 310 as discussed above. The plasma is formed in the processing region 324 by applying sufficient source power from the generators 338 to the reentrant conduits 326, 328 to create plasma ion currents in the conduits 326, 328 and in the processing region 324 in accordance with the process described above. In some embodiments, the substrate bias voltage delivered by the RF bias power generator 342 can be adjusted to control the flux of ions to the substrate surface, and possibly one or more of the thickness a layer formed on the substrate or the concentration of plasma species embedded in the substrate surface.

Figure 4:
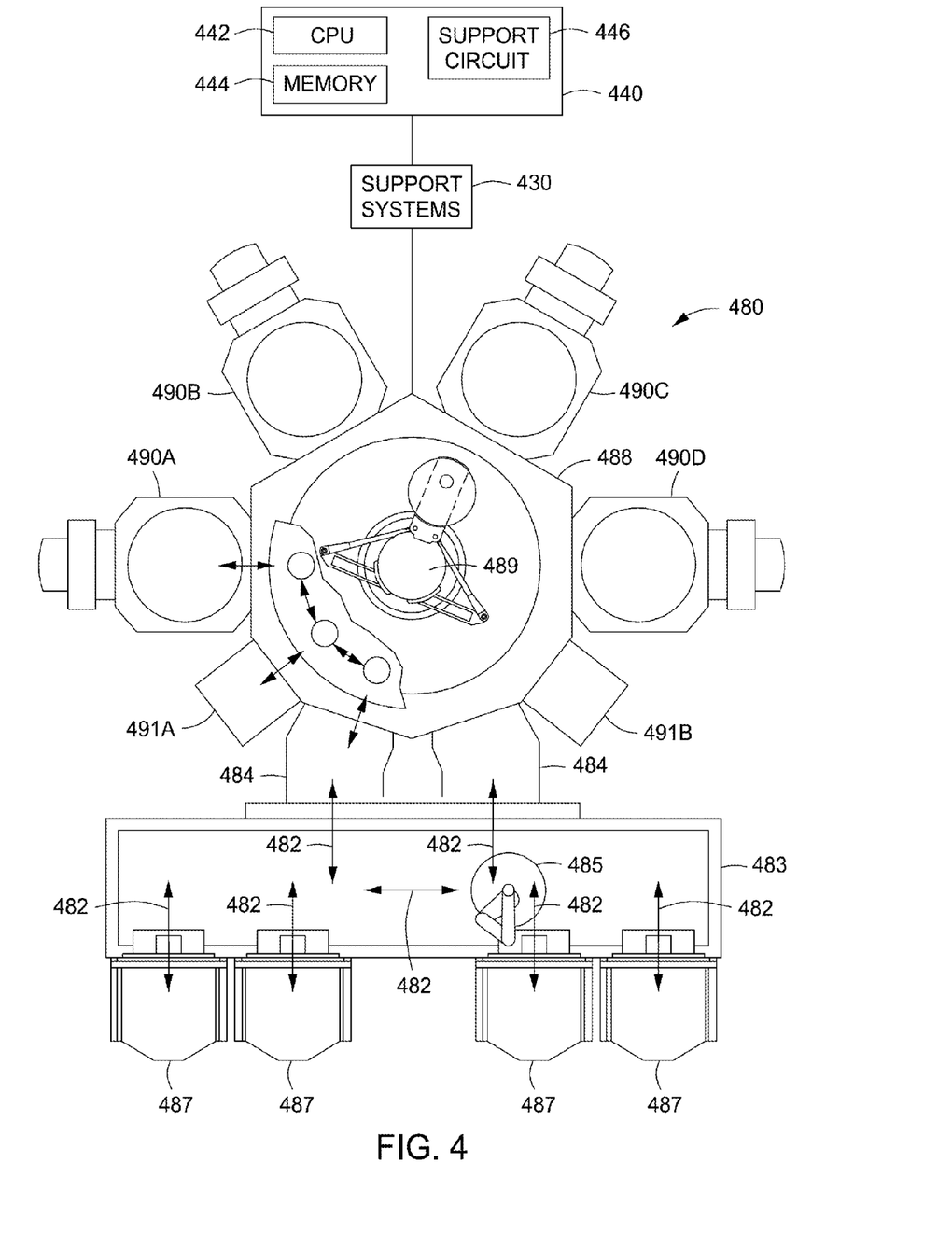
FIG. 4 depicts a cluster tool suitable for performing portions of the present invention in accordance with some embodiments of the present invention.

FIG. 4 depicts a cluster tool suitable for performing portions of the present invention. Generally, the cluster tool is a modular system comprising multiple chambers which perform various functions including substrate center-finding and orientation, capping, annealing, deposition and/or etching. In accordance with the embodiments of the present invention, the cluster tool may include a annealing process chamber, a capping process chamber, a etching process chamber, and a layer deposition process chamber configured to perform the inventive steps described in the method 100 of the present invention. The multiple process chambers of the cluster tool are mounted to a central transfer chamber which houses a robot adapted to shuttle substrates between the chambers. The transfer chamber is typically maintained at a vacuum condition and provides an intermediate stage for shuttling substrates from one chamber to another and/or to a load lock chamber positioned at a front end of the cluster tool. The details of one such staged-vacuum substrate processing system is disclosed in U.S. Pat. No. 5,186,718, entitled "Staged-Vacuum Substrate Processing System and Method," Tepman et al., issued on Feb. 16, 1993. However, the exact arrangement and combination of chambers may be altered for purposes of performing specific steps of a fabrication process, which includes the present conformal doping methods for limiting dopant loss and achieving enhanced dopant diffusion.

By way of illustration, a particular cluster tool 480 is shown in a plan view in FIG. 4. The cluster tool 480 generally comprises a plurality of chambers and robots and is preferably equipped with a microprocessor controller 440 programmed to carry out the various processing methods performed in the cluster tool 480. A front-end environment 483 is shown positioned in selective communication with a pair of load lock chambers 484. A pod loader 485 disposed in the front-end environment 483 is capable of linear and rotational movement (arrows 482) to shuttle cassettes of substrates between the load locks 484 and a plurality of pods 487 which are mounted on the front-end environment 483. The load locks 484 provide a first vacuum interface between the front-end environment 483 and a transfer chamber 488. Two load locks 484 are provided to increase throughput by alternatively communicating with the transfer chamber 488 and the front-end environment 483. Thus, while one load lock 484 communicates with the transfer chamber 488, a second load lock 484 communicates with the front-end environment 483. A robot 489 is centrally disposed in the transfer chamber 488 to transfer substrates from the load locks 484 to one of the various processing chambers 490 and service chambers 491. The processing chambers 490 may perform any number of processes such as physical vapor deposition, chemical vapor deposition, and etching while the service chambers 491 are adapted for degassing, orientation, cooldown and the like.

In embodiments of the present invention, at least one of the processing chambers 490 is configured as a plasma doping process chamber, such as chamber 300, illustrated in FIG. 3, or the P3i chamber available from Applied Materials; and at least one of the processing chambers 490 is configured as an annealing process chamber 490. In some embodiments, the plasma doping chamber may be used to form the dopant region 202 on the substrate 200, to form the cap layer 204 atop the dopant region 202, and to remove the cap layer 204. The dopant activation chamber may be used to anneal the dopant region 202 after the cap layer 204 is formed. The inclusion of both chambers on the cluster tool 480 allows the substrate 200 to remain free from contamination and prevents exposure of the substrate to the atmosphere in order to prevent dopant loss.

In some embodiments, a first process chamber 490A (e.g., the plasma doping chamber) is used to form the dopant region 202 on the substrate 200, a second process chamber 490B (e.g., the deposition chamber) is used to deposit the cap layer 204 atop the dopant region 202, a third process chamber 490C (e.g., the dopant activation chamber) is used to anneal the dopant region 202 after the cap layer 204 is formed, and a fourth process chamber 490D (e.g., the etch chamber) is used to remove the cap layer 204 after the dopant region 202 is annealed. Alternatively, at least one of the etch chamber and/or the dopant activation chamber may be disposed remote from the cluster tool 480.

In embodiments where the thickness of the cap layer 204 is reduced prior to annealing the dopant region 202, the etching of the cap layer 204 may be performed in the plasma doping chamber, or in a separate etch chamber coupled to the cluster tool 480.

In some embodiments, forming the dopant region 202 on the substrate 200 and forming the cap layer 204 atop the dopant region 202 may take place in the cluster tool 480, while reducing the thickness of the cap layer prior to annealing the dopant region 202, annealing the dopant region 202 after the cap layer 204 is formed, and removing the cap layer 204 may take place in one or more separate process chambers disposed remote from the cluster tool.

The controller 440 generally comprises a central processing unit (CPU) 442, a memory 444, and support circuits 446 and is coupled to and controls the cluster tool 480 and support systems 430, directly (as shown in FIG. 4) or, alternatively, via computers (or controllers) associated with the process chamber and/or the support systems.

The controller 440 may contain a computer-readable medium having instruction stored thereon for performing the methods described above in accordance with the embodiments of the invention. When the computer-readable medium is read by the controller, the controller 440 issues instructions to perform the inventive methods to the process chambers 490 directly, or alternatively, via computers (or controllers) associated with the process chambers 490 and/or their support systems. Alternatively, the computer-readable medium for performing the methods of the invention may be contained on the controllers associated with the process chambers 490.

Thus, methods for limiting dopant loss and achieving enhanced dopant diffusion are provided herein. While the foregoing is directed to embodiments of the present invention, other and further embodiments of the invention may be devised without departing from the basic scope thereof.

The invention claimed is:

1. A method of doping a substrate, comprising:
    forming a dopant region on a substrate by implanting one or more dopant elements into the dopant region of the substrate using a plasma doping process;
    forming a cap layer atop the dopant region, wherein the cap layer is formed over a substantial portion of the dopant region;
    reducing a thickness of the cap layer prior to annealing the dopant region;
    annealing the dopant region after forming the cap layer; and
    removing the cap layer after annealing the dopant region.

2. The method of claim 1, wherein forming the dopant region on the substrate further comprises:
    implanting at least one of an arsenic containing dopant element or a phosphorus containing dopant element into the dopant region of the substrate.

3. The method of claim 1, wherein forming the dopant region on the substrate further comprises:
    implanting at least one of boron trifluoride ($BF_3$), diborane ($B_2H_6$), methane ($CH_4$), carbon tetrafluoride ($CF_4$), phosphorus trifluoride ($PF_3$), di-arsenic fluoride ($As_2F_5$), antimony (Sb), or indium (In) into the dopant region of the substrate.

4. The method of claim 1, wherein forming the dopant region on the substrate further comprises:
    applying a substrate bias voltage to the substrate while forming the dopant region.

5. The method of claim 1, wherein zero voltage power is applied to the substrate during the plasma doping process.

6. The method of claim 1, wherein forming the cap layer further comprises:
    depositing a silicon-containing material atop the dopant region.

7. The method of claim 1, wherein the cap layer is deposited to a thickness of up to about 100 angstroms.

8. The method of claim 1, further comprising annealing the dopant region at a temperature of about 600 to about 1300 degrees Celsius.

9. The method of claim 1, wherein forming the dopant region and forming the cap layer atop the dopant region are performed without exposing the substrate to atmosphere.

10. The method of claim 1, further comprising:
    using a first process chamber of a cluster tool to form the dopant region on the substrate and to form the cap layer atop the dopant region;
    using a second process chamber on the cluster tool or a remote process chamber to anneal the dopant region after forming the cap layer; and
    using the first process chamber to remove the cap layer after annealing the dopant region.

11. The method of claim 1, further comprising
    using a first process chamber of a cluster tool to form the dopant region on the substrate;
    using a second process chamber on the cluster tool to form the cap layer atop the dopant region;
    using a third process chamber on the cluster tool or a remote process chamber to anneal the dopant region after forming the cap layer; and
    using a fourth process chamber of the cluster tool to remove the cap layer atop the dopant region.

12. The method of claim 6, wherein the silicon-containing material comprises at least one of silicon dioxide ($SiO_2$) or silicon carbide (SiC).

13. The method of claim 9, wherein forming the dopant region and forming the cap layer atop the dopant region are performed in the same process chamber.

14. The method of claim 9, further comprising:
    exposing the substrate to the atmosphere only after the cap layer is formed atop the dopant region.

15. A method of doping a substrate, comprising:
    forming a dopant region on a substrate by implanting one or more dopant elements into the dopant region of the substrate in a plasma doping process;
    forming a cap layer atop the dopant region;
    reducing a thickness of the cap layer;
    annealing the dopant region after reducing the thickness of the cap layer; and
    removing the cap layer from atop the dopant region after annealing the dopant region.

16. The method of claim 15, wherein forming the dopant region and forming the cap layer are performed in the same process chamber without exposing the substrate to atmosphere.

17. The method of claim 16, wherein forming the dopant region, forming the cap layer, reducing the thickness of the cap layer, and removing the cap layer are performed in the same process chamber.

18. A method of doping a substrate, comprising:
forming a dopant region on a substrate by implanting one or more dopant elements into the dopant region of the substrate using a plasma doping process;
forming a cap layer atop the dopant region;
reducing a thickness of the cap layer prior to annealing the dopant region;
annealing the dopant region after reducing the thickness of the cap layer; and
removing the cap layer after annealing the dopant region.

* * * * *